US012811565B2

(12) United States Patent
Inoue et al.

(10) Patent No.: US 12,811,565 B2
(45) Date of Patent: Nov. 24, 2026

(54) ACOUSTIC WAVE DEVICE AND METHOD OF MANUFACTURING ACOUSTIC WAVE DEVICE

(71) Applicant: Murata Manufacturing Co., Ltd., Nagaokakyo (JP)

(72) Inventors: Kazunori Inoue, Nagaokakyo (JP); Naohiro Nodake, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 878 days.

(21) Appl. No.: 18/124,006

(22) Filed: Mar. 21, 2023

(65) Prior Publication Data

US 2023/0223923 A1 Jul. 13, 2023

Related U.S. Application Data

(63) Continuation of application No. PCT/JP2021/036531, filed on Oct. 1, 2021.

(Continued)

(51) Int. Cl.

*H03H 9/00* (2006.01)
*H03H 3/02* (2006.01)

(Continued)

(52) U.S. Cl.

CPC .............. *H03H 9/174* (2013.01); *H03H 3/02* (2013.01); *H03H 9/02031* (2013.01);

(Continued)

(58) Field of Classification Search

CPC ...... H03H 9/174; H03H 3/02; H03H 9/02031; H03H 9/02228; H03H 9/13; H03H 9/176;

(Continued)

(56) References Cited

U.S. PATENT DOCUMENTS

2008/0020573 A1* 1/2008 Birkmeyer ............... B41J 2/161 216/34
2014/0152145 A1* 6/2014 Kando ............... H03H 9/02574 29/25.35

(Continued)

FOREIGN PATENT DOCUMENTS

JP 2012257019 A 12/2012
JP 2018129561 A 8/2018

(Continued)

OTHER PUBLICATIONS

International Search Report in PCT/JP2021/036531, mailed Dec. 21, 2021, 3 pages.

(Continued)

*Primary Examiner* — Julio C. Gonzalez
(74) *Attorney, Agent, or Firm* — Keating & Bennett, LLP

(57) ABSTRACT

An acoustic wave device includes a support substrate, an inorganic film over the support substrate, a piezoelectric layer over the inorganic film, and an electrode over the piezoelectric layer. A portion of the support substrate includes a hollow that overlaps at least a portion of the electrode in a thickness direction of the support substrate. An inner wall of the inorganic film is located farther from the hollow than a location on an inner wall of the support substrate, the location being closest to the piezoelectric layer, the inner wall of the support substrate defining the hollow.

19 Claims, 10 Drawing Sheets

Related U.S. Application Data

(60) Provisional application No. 63/086,643, filed on Oct. 2, 2020.

(51) Int. Cl.
*H03H 9/02* (2006.01)
*H03H 9/13* (2006.01)
*H03H 9/17* (2006.01)

(52) U.S. Cl.
CPC .......... *H03H 9/02228* (2013.01); *H03H 9/13* (2013.01); *H03H 9/176* (2013.01); *H03H 2003/023* (2013.01)

(58) Field of Classification Search
CPC ......... H03H 2003/023; H03H 9/02047; H03H 9/02157
See application file for complete search history.

(56) References Cited

U.S. PATENT DOCUMENTS

| | | | |
|---|---|---|---|
| 2019/0036509 | A1 | 1/2019 | Tai et al. |
| 2020/0295730 | A1 | 9/2020 | Nagatomo et al. |

FOREIGN PATENT DOCUMENTS

| | | | | |
|---|---|---|---|---|
| JP | 2020150415 | A | * | 9/2020 |
| WO | 2012073871 | A1 | | 6/2012 |
| WO | 2016147687 | A1 | | 9/2016 |
| WO | 2017163729 | A1 | | 9/2017 |
| WO | 2019111664 | A1 | | 6/2019 |

OTHER PUBLICATIONS

Written Opinon in PCT/JP2021/036531, mailed Dec. 21, 2021, 4 pages.

* cited by examiner

ACOUSTIC WAVE DEVICE AND METHOD OF MANUFACTURING ACOUSTIC WAVE DEVICE

CROSS REFERENCE TO RELATED APPLICATIONS

This application claims the benefit of priority to Provisional Application No. 63/086,643 filed on Oct. 2, 2020 and is a Continuation Application of PCT Application No. PCT/JP2021/036531 filed on Oct. 1, 2021. The entire contents of each application are hereby incorporated herein by reference.

BACKGROUND OF THE INVENTION

1. Field of the Invention

The present invention relates to an acoustic wave device, and a method of manufacturing an acoustic wave device.

2. Description of the Related Art

Japanese Unexamined Patent Application Publication No. 2012-257019 describes an acoustic wave device.

A case is considered in which the acoustic wave device described in Japanese Unexamined Patent Application Publication No. 2012-257019 includes an inorganic insulating layer (to be referred to as "inorganic film" hereinafter) disposed between a support and a piezoelectric substrate. In this case, if a residue of the inorganic film is present in a region that overlaps a hollow portion in plan view as seen in the thickness direction, this can potentially lead to degradation of filter characteristics. A need thus exists to reduce degradation of filter characteristics caused by such a residue of the inorganic film.

SUMMARY OF THE INVENTION

Preferred embodiments of the present invention provide acoustic wave devices and methods of manufacturing acoustic wave devices that each reduce or prevent degradation of filter characteristics caused by a residue of an inorganic film.

An acoustic wave device according to a preferred embodiment of the present invention includes a support substrate, an inorganic film located over the support substrate, a piezoelectric layer located over the inorganic film, and an electrode located over the piezoelectric layer. A portion of the support substrate includes a hollow portion. The hollow portion overlaps at least a portion of the electrode in a thickness direction of the support substrate. An inner wall of the inorganic film is located farther from the hollow portion than is a location on an inner wall of the support substrate, the location being a location closest to the piezoelectric layer, the inner wall of the support substrate defining the hollow portion.

A method of manufacturing an acoustic wave device according to a preferred embodiment of the present invention includes roughening a first surface of a support substrate, the support substrate including the first surface and a second surface, forming an inorganic film over the first surface, forming a piezoelectric layer over the inorganic film, thinning the piezoelectric layer, forming an electrode over the piezoelectric layer, forming a hollow portion in a portion of the support substrate, and etching the inorganic film exposed in the hollow portion.

Preferred embodiments of the present invention each reduce or prevent degradation of filter characteristics caused by a residue of an inorganic film.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below in detail with reference to the drawings. The preferred embodiments, however, are not intended to be limiting of the present disclosure.

First Preferred Embodiment

Figure 1A:
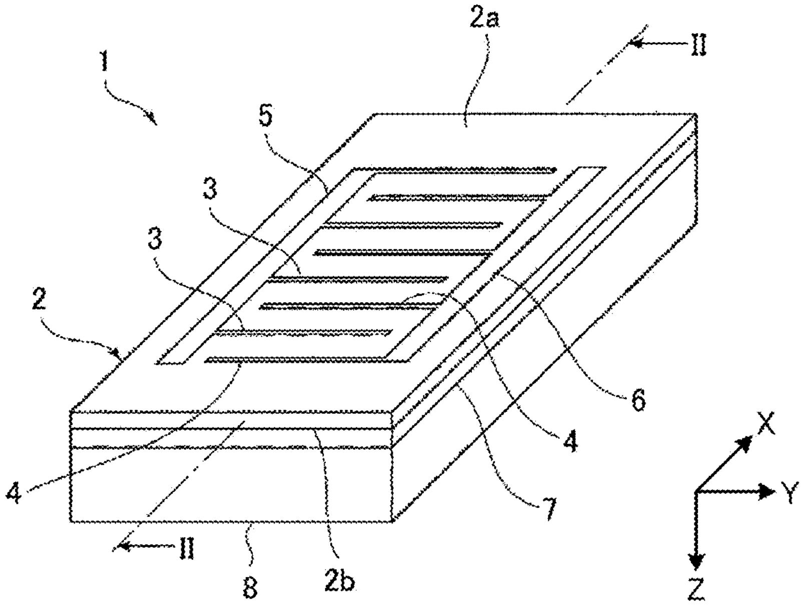
FIG. 1A is a perspective view of an acoustic wave device according to a first preferred embodiment of the present invention.
Figure 1B:
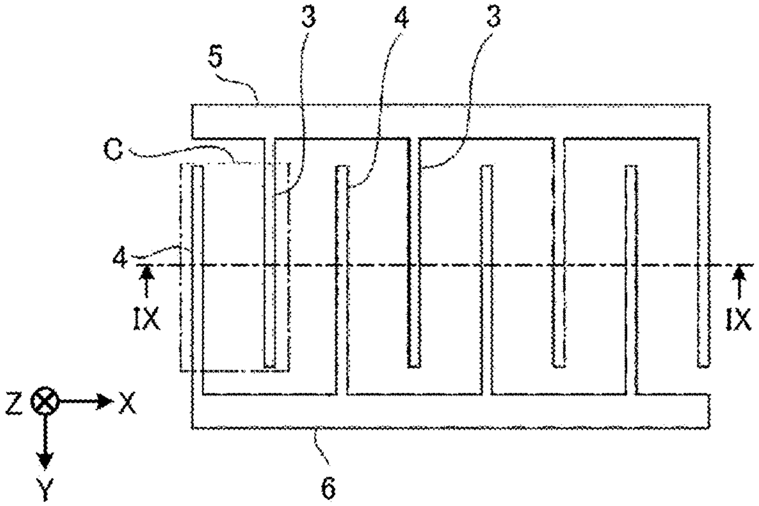
FIG. 1B is a plan view of an arrangement of electrodes according to the first preferred embodiment of the present invention.

FIG. 1A is a perspective view of an acoustic wave device according to a first preferred embodiment of the present invention. FIG. 1B is a plan view of an arrangement of electrodes according to the first preferred embodiment.

An acoustic wave device 1 according to the first preferred embodiment includes a piezoelectric layer 2 made of, for example, $LiNbO_3$. The piezoelectric layer 2 may be made of, for example, $LiTaO_3$. The $LiNbO_3$ or $LiTaO_3$ has a Z-cut angle according to the first preferred embodiment. The $LiNbO_3$ or $LiTaO_3$ may have a rotated Y-cut angle or an X-cut angle. Preferred orientations of propagation are, for example, Y-propagation and X-propagation about ±30°.

Although the thickness of the piezoelectric layer 2 is not particularly limited, from the viewpoint of effectively exciting a first-order thickness shear mode, the piezoelectric layer 2 preferably has a thickness of, for example, greater than or equal to about 50 nm and less than or equal to about 1000 nm.

The piezoelectric layer 2 includes a first surface 2*a* and a second surface 2*b* that are opposite to each other in a Z-direction. An electrode 3 and an electrode 4 are disposed over the first surface 2*a*.

The electrode 3 corresponds to an example of a "first electrode", and the electrode 4 corresponds to an example of a "second electrode". In FIGS. 1A and 1B, a plurality of electrodes 3 (hereinafter referred to in the singular as "electrode 3" for convenience unless otherwise indicated) are connected to a first busbar electrode 5. A plurality of electrodes 4 (hereinafter referred to in the singular as "electrode 4" for convenience unless otherwise indicated) are connected to a second busbar electrode 6. Each electrode 3 and each electrode 4 are interdigitated with each other.

Each of the electrode 3 and the electrode 4 has a rectangular or substantially rectangular shape, and has a longitudinal direction. In a direction orthogonal or substantially orthogonal to the longitudinal direction, the electrode 3, and the electrode 4 adjacent to the electrode 3 face each other. The longitudinal direction of the electrodes 3 and 4, and a direction orthogonal or substantially orthogonal to the longitudinal direction of the electrodes 3 and 4 are each a direction that crosses the thickness direction of the piezoelectric layer 2. Thus, the electrode 3, and the electrode 4 adjacent to the electrode 3 face each other in a direction that crosses the thickness direction of the piezoelectric layer 2. In the following description, it will sometimes be assumed that the thickness direction of the piezoelectric layer 2 is a Z-direction (or a first direction), a direction orthogonal or substantially orthogonal to the longitudinal direction of the electrodes 3 and 4 is an X-direction (or a second direction), and the longitudinal direction of the electrodes 3 and 4 is a Y-direction (or a third direction).

The longitudinal direction of the electrodes 3 and 4 may be interchanged with the direction orthogonal or substantially orthogonal to the longitudinal direction of the electrodes 3 and 4 illustrated in FIGS. 1A and 1B. That is, the electrode 3 and the electrode 4 may extend in a direction in which the first busbar electrode 5 and the second busbar electrode 6 extend in FIGS. 1A and 1B. In this case, the first busbar electrode 5 and the second busbar electrode 6 extend in a direction in which the electrode 3 and the electrode 4 extend in FIGS. 1A and 1B. A plurality of pairs of mutually adjacent electrodes 3 and 4, each pair including the electrode 3 connected with one potential and the electrode 4 connected with the other potential, are disposed in the direction orthogonal or substantially orthogonal to the longitudinal direction of the electrodes 3 and 4.

When it is stated herein that the electrode 3 and the electrode 4 are adjacent to each other, it is not meant that the electrode 3 and the electrode 4 are disposed in direct contact with each other, but it is meant that the electrode 3 and the electrode 4 are disposed with a spacing therebetween. Further, if the electrode 3 and the electrode 4 are adjacent to each other, no electrode connected with a hot electrode or a ground electrode, such as another electrode 3 or 4, is present between the adjacent electrodes 3 and 4. The number of such electrode pairs does not necessary be an integer, but may be 1.5, 2.5, or other non-integer.

The center-to-center distance, that is, the pitch between the electrodes 3 and 4 is preferably, for example, greater than or equal to about 1 μm and less than or equal to about 10 μm. The center-to-center distance between the electrodes 3 and 4 refers to the distance between the center of the width dimension of the electrode 3 in a direction orthogonal to the longitudinal direction of the electrode 3, and the center of the width dimension of the electrode 4 in a direction orthogonal or substantially orthogonal to the longitudinal direction of the electrode 4.

Further, if at least one of the number of electrodes 3 and the number of electrodes 4 is more than one (i.e., if, with the electrode 3 and the electrode 4 defined as one pair of electrodes, there are 1.5 or more pairs of electrodes), the center-to-center distance between the electrodes 3 and 4 refers to the mean of the center-to-center distances of mutually adjacent electrodes 3 and 4 among the 1.5 or more pairs of electrodes 3 and 4.

The width of each of the electrodes 3 and 4, that is, the dimension of each of the electrodes 3 and 4 in a direction in which the electrodes 3 and 4 face each other is preferably, for example, greater than or equal to about 150 nm and less than or equal to about 1000 nm. The center-to-center distance between the electrodes 3 and 4 refers to the distance between the center of the dimension (width dimension) of the electrode 3 in the direction orthogonal to the longitudinal direction of the electrode 3, and the center of the dimension (width dimension) of the electrode 4 in the direction orthogonal or substantially orthogonal to the longitudinal direction of the electrode 4.

Since the piezoelectric layer according to the first preferred embodiment is a Z-cut piezoelectric layer, the direction orthogonal or substantially orthogonal to the longitudinal direction of the electrodes 3 and 4 is a direction orthogonal or substantially orthogonal to the polarization direction of the piezoelectric layer 2. This, however, is not the case if a piezoelectric with another cut-angle is used as the piezoelectric layer 2. As used herein, the term "orthogonal" may encompass not only strictly orthogonal but also substantially orthogonal (i.e., when the direction orthogonal to the longitudinal direction of the electrodes 3 and 4, and the polarization direction make an angle of, for example, about 90°±10°).

Figure 2:
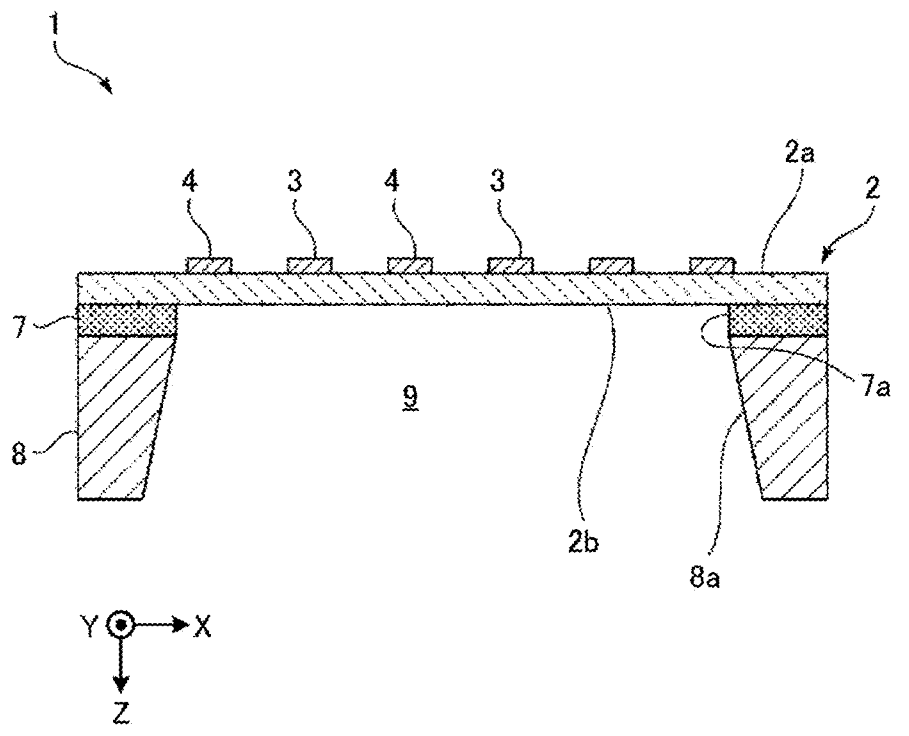
FIG. 2 is a cross-sectional view taken along a line II-II in FIG. 1A.

A support substrate 8 is stacked over the second surface 2*b* of the piezoelectric layer 2 with an intermediate layer 7 interposed therebetween. The intermediate layer 7 and the support substrate 8 have a frame shape, and respectively include a cavity 7*a* and a cavity 8*a* as illustrated in FIG. 2. Due to the configuration described above, a hollow portion (air gap) 9 is provided.

The hollow portion 9 is provided so that vibration of an excitation region C of the piezoelectric layer 2 is not prevented. Accordingly, the support substrate 8 is stacked over the second surface 2*b* with the intermediate layer 7 interposed therebetween, at a location not overlapping an area where at least one pair of electrodes 3 and 4 is provided.

The intermediate layer 7 is an insulating layer, and made of, for example, silicon oxide. The intermediate layer 7 is, for example, an inorganic film. It is to be noted, however, that the intermediate layer 7 may be an inorganic film made of any suitable insulating material other than silicon oxide, such as, for example, silicon oxynitride or alumina.

The support substrate 8 is made of, for example, Si. The plane orientation of a surface of Si near the piezoelectric layer 2 may be (100) or (110), or may be (111). Preferably, the Si used has a high resistivity, for example, greater than or equal to 4 kΩ. However, the support substrate 8 may be made of any suitable insulating material or semiconductor material. Examples of suitable materials of the support substrate 8 may include piezoelectrics such as aluminum oxide, lithium tantalate, lithium niobate, and quartz, various ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride.

The electrodes 3, the electrodes 4, the first busbar electrode 5, and the second busbar electrode 6 are each made of any suitable metal or alloy such as Al or AlCu alloy, for example. According to the first preferred embodiment, each of the electrode 3, the electrode 4, the first busbar electrode 5, and the second busbar electrode 6 is, for example, a stack of an Al film on a Ti film. However, an adhesion layer other than a Ti film may be used.

During driving, an alternating-current voltage is applied between the electrodes 3 and the electrodes 4. More specifically, an alternating-current voltage is applied between the first busbar electrode 5 and the second busbar electrode 6. This makes it possible to provide resonance characteristics using bulk waves in a first-order thickness shear mode excited in the piezoelectric layer 2.

The acoustic wave device 1 is designed such that d/p is, for example, less than or equal to about 0.5, where d is the thickness of the piezoelectric layer 2, and p is the center-to-center distance between any mutually adjacent electrodes 3 and 4 among a plurality of pairs of electrodes 3 and 4. This makes it possible to effectively excite the bulk waves in the first-order thickness shear mode, and consequently provide resonance characteristics. More preferably, for example, d/p is less than or equal to about 0.24, in which case further improved resonance characteristics can be provided.

If at least one of the number of electrodes 3 and the number of electrodes 4 is more than one as with the first preferred embodiment, that is, if, with the electrode 3 and the electrode 4 defined as one pair of electrodes, there are 1.5 or more pairs of electrodes 3 and 4, the center-to-center distance p between mutually adjacent electrodes 3 and 4 refers to the mean of the center-to-center distances of the respective pairs of mutually adjacent electrodes 3 and 4.

The above-described configuration of the acoustic wave device 1 according to the first preferred embodiment helps to reduce a decrease in Q-factor, even if the number of pairs of electrodes 3 and 4 is reduced to achieve miniaturization. This is because the resulting resonator does not require a reflector on each side, and thus has no insertion loss. The reason why no reflector is required is because bulk waves in the first-order thickness shear mode are used.

Figure 3A:
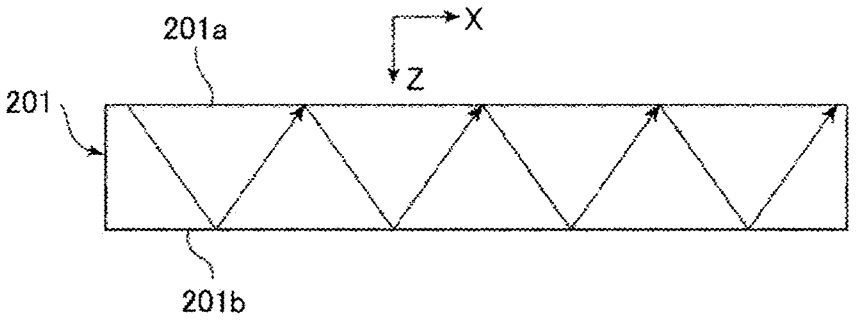
FIG. 3A is a schematic cross-sectional illustration for explaining Lamb waves propagating in a piezoelectric layer according to Comparative Example.
Figure 3B:
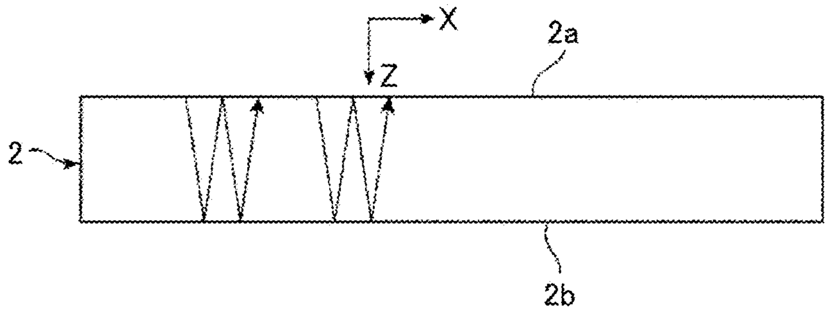
FIG. 3B is a schematic cross-sectional illustration for explaining bulk waves in a first-order thickness shear mode that propagate in a piezoelectric layer according to the first preferred embodiment of the present invention.
Figure 4:
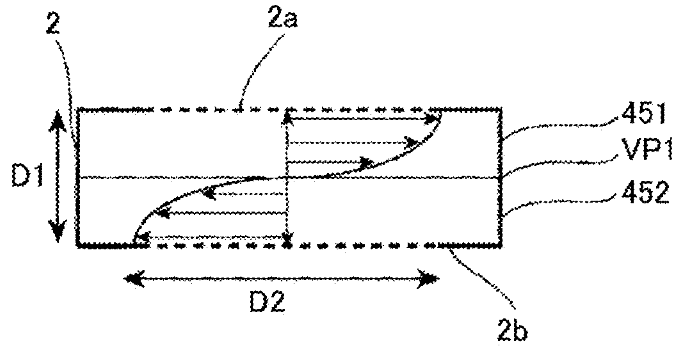
FIG. 4 is a schematic cross-sectional illustration for explaining the amplitude directions of bulk waves in the first-order thickness shear mode that propagate in the piezoelectric layer according to the first preferred embodiment of the present invention.

FIG. 3A is a schematic cross-sectional illustration for explaining Lamb waves propagating in a piezoelectric layer according to Comparative Example. FIG. 3B is a schematic cross-sectional illustration for explaining bulk waves in first-order thickness shear mode that propagate in the piezoelectric layer according to the first preferred embodiment. FIG. 4 is a schematic cross-sectional illustration for explaining the amplitude directions of bulk waves in first-order thickness shear mode that propagate in the piezoelectric layer according to the first preferred embodiment.

FIG. 3A illustrates an acoustic wave device similar to the one described in Japanese Unexamined Patent Application Publication No. 2012-257019, with Lamb waves propagating in the piezoelectric layer. As illustrated in FIG. 3A, the waves propagate within a piezoelectric layer 201 as indicated by arrows. The piezoelectric layer 201 includes a first surface 201*a*, and a second surface 201*b*. The thickness direction connecting the first surface 201*a* and the second surface 201*b* is defined as the Z-direction. The X-direction refers to a direction in which the fingers of an interdigital transducer (IDT) electrode are arranged. As illustrated in FIG. 3A, Lamb waves propagate in the X-direction. Although the piezoelectric layer 201 vibrates as a whole due to the Lamb waves being plate waves, since the waves propagate in the X-direction, a reflector is disposed on each side to provide resonance characteristics. This results in wave propagation loss. Therefore, miniaturization, that is, a reduction in the number of pairs of electrode fingers results in a decrease in Q-factor.

In contrast, with the acoustic wave device according to the first preferred embodiment, vibration displacement occurs in the thickness shear direction as illustrated in FIG. 3B. This results in the waves propagating substantially in the direction connecting the first surface 2*a* and the second surface 2*b* of the piezoelectric layer 2, that is, in the Z-direction, to achieve resonance. That is, the waves have an extremely small X-direction component relative to their Z-direction component. Since the wave propagation in Z-direction the provides the resonance characteristics, no reflector is required. This means that no propagation loss due to wave propagation through the reflector occurs. This helps to reduce a decrease in Q-factor, even if the number of pairs of electrodes 3 and 4 is reduced to achieve further miniaturization.

As illustrated in FIG. 4, the amplitude direction of bulk waves in first-order thickness shear mode is opposite between a first region 451 and a second region 452, which are included in the excitation region C of the piezoelectric layer 2 (see FIG. 1B). FIG. 4 schematically illustrates bulk waves generated upon application of a voltage between the electrode 3 and the electrode 4 such that the electrode 4 is at a higher potential than the electrode 3. The first region 451 is a portion of the excitation region C located between a virtual plane VP1 and the first surface 2*a*, the virtual plane VP1 being orthogonal or substantially orthogonal to the thickness direction of the piezoelectric layer 2 and dividing the piezoelectric layer 2 into two regions. The second region 452 is a portion of the excitation region C located between the virtual plane VP1 and the second surface 2*b*.

As described above, the acoustic wave device 1 includes at least one pair of electrodes including the electrode 3 and the electrode 4. Since the acoustic wave device 1 is not designed for wave propagation in the X-direction, the acoustic wave device 1 does not necessarily need to include a plurality of such electrode pairs each including the electrode 3 and the electrode 4. That is, the acoustic wave device 1 may simply include at least one pair of electrodes.

For example, the electrode 3 is connected with a hot potential, and the electrode 4 is connected with a ground potential. Alternatively, however, the electrode 3 may be connected with a ground potential, and the electrode 4 may be connected with a hot potential. According to the first preferred embodiment, at least one pair of electrodes includes an electrode to be connected with a hot potential or an electrode to be connected with a ground potential as described above, and no floating electrode is provided.

Figure 5:
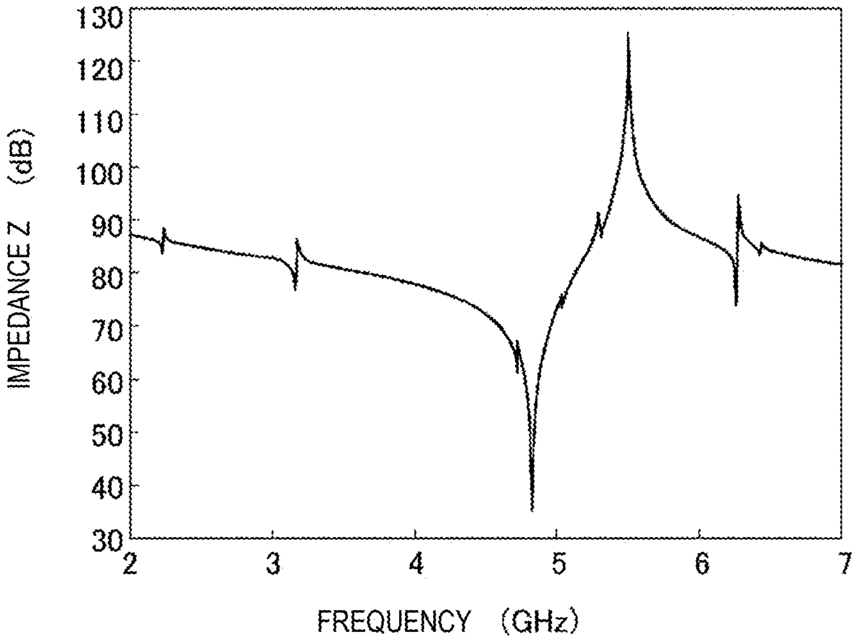
FIG. 5 illustrates an example of the resonance characteristics of the acoustic wave device according to the first preferred embodiment of the present invention.

FIG. 5 illustrates an example of the resonance characteristics of the acoustic wave device according to the first preferred embodiment. The acoustic wave device 1 with the resonance characteristics illustrated in FIG. 5 has design parameters described below.

Piezoelectric layer 2: $LiNbO_3$ with Euler angles (0°, 0°, 90°)

Thickness of piezoelectric layer 2: about 400 nm

Length of excitation region C (see FIG. 1B): about 40 μm

Number of electrode pairs each including the electrode 3 and the electrode 4: 21

Center-to-center distance (pitch) p between electrodes 3 and 4: about 3 μm Width of electrodes 3 and 4: about 500 nm d/p: about 0.133

Intermediate layer 7: silicon oxide film with thickness of about 1 μm

Support substrate 8: Si

The excitation region C (see FIG. 1B) refers to a region where the electrodes 3 and 4 overlap each other when viewed in the X-direction, which is a direction orthogonal or substantially orthogonal to the longitudinal direction of the electrodes 3 and 4. The length of the excitation region C refers to a dimension of the excitation region C in the longitudinal direction of the electrodes 3 and 4.

According to the first preferred embodiment, the center-to-center distance is set equal or substantially equal between all pairs of electrodes 3 and 4. That is, the electrodes 3 and 4 are disposed at equal or substantially equal pitches.

As can be appreciated from FIG. 5, improved resonance characteristics with a fractional band width of about 12.5% are obtained, even though no reflector is provided.

According to the first preferred embodiment, d/p is, for example, less than or equal to about 0.5, and more preferably less than or equal to about 0.24, where d is the thickness of the piezoelectric layer 2, and p is the center-to-center distance between the electrode 3 and the electrode 4. This is explained below with reference to FIG. 6.

Figure 6:
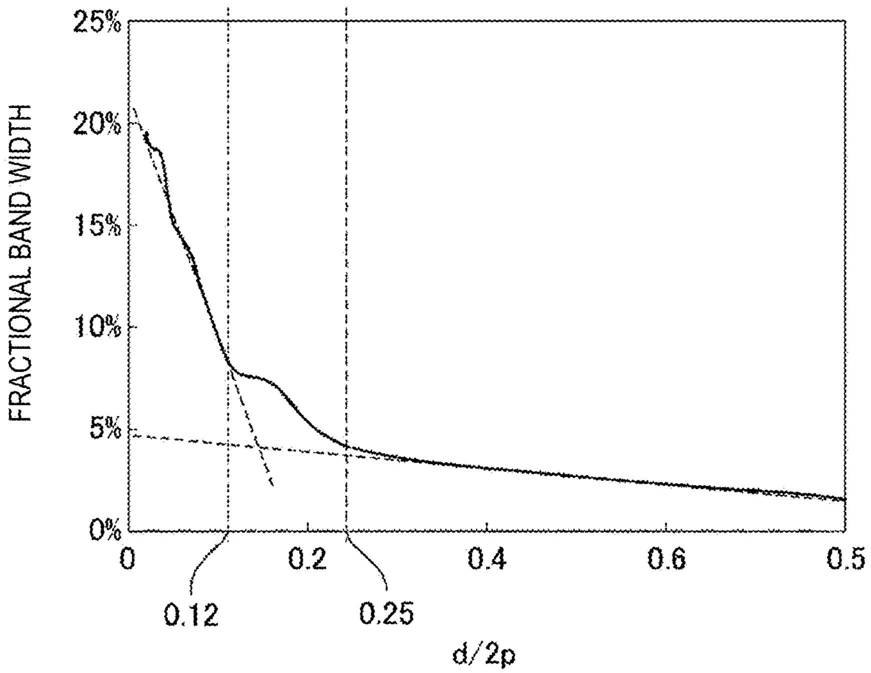
FIG. 6 illustrates, for the acoustic wave device according to the first preferred embodiment of the present invention, a relationship between d/2p, and the fractional band width of the acoustic wave device defining and functioning as a resonator, where p is the center-to-center distance between mutually adjacent electrodes or the mean center-to-center distance, and d is the mean thickness of the piezoelectric layer.

A plurality of acoustic wave devices are obtained in the same manner as with the acoustic wave device having the resonant characteristics illustrated in FIG. 5, but with varying values of d/2p. FIG. 6 illustrates, for the acoustic wave device according to the first preferred embodiment, the relationship between d/2p, and the fractional band width of the acoustic wave device serving as a resonator, where p is the center-to-center distance between mutually adjacent electrodes or the mean center-to-center distance, and d is the mean thickness of the piezoelectric layer.

As illustrated in FIG. 6, when d/2p exceeds about 0.25, that is, when d/p>about 0.5, the fractional band width remains below about 5% even as d/p is adjusted. By contrast, when d/2p≤about 0.25, that is, when d/p≤about 0.5, varying d/p within this range makes it possible to provide a fractional band width of greater than or equal to about 5%, that is, a resonator with a high coupling coefficient. When d/2p is less than or equal to about 0.12, that is, when d/p is less than or equal to about 0.24, the fractional band width can be increased to be greater than or equal to about 7%. In addition, adjusting d/p within this range makes it possible to provide a resonator with an even greater fractional band width, and consequently with an even higher coupling coefficient. It can therefore be appreciated that setting d/p less than or equal to about 0.5 makes it possible to provide a resonator with a high coupling coefficient that employs the bulk waves in first-order thickness shear mode mentioned above.

The at least one pair of electrodes described above may be one pair of electrodes, in which case the value of p mentioned above is the center-to-center distance between mutually adjacent electrodes 3 and 4. If there are 1.5 or more pairs of electrodes, the mean of the center-to-center distances of mutually adjacent electrodes 3 and 4 may be defined as p. Similarly, as for the thickness d of the piezoelectric layer, if the piezoelectric layer 2 has thickness variations, its averaged thickness may be used.

Figure 7:
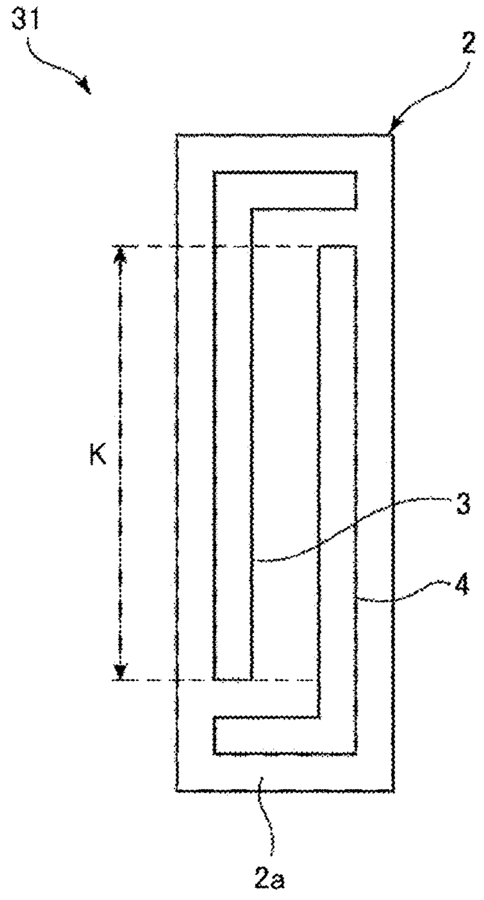
FIG. 7 is a plan view of an example of the acoustic wave device according to the first preferred embodiment of the present invention that includes one pair of electrodes.

FIG. 7 is a plan view of an example of the acoustic wave device according to the first preferred embodiment that includes one pair of electrodes. An acoustic wave device 31 includes one pair of electrodes 3 and 4 disposed over the first surface 2*a* of the piezoelectric layer 2. In FIG. 7, K represents intersecting width. As previously mentioned, the acoustic wave device according to the present disclosure may include one pair of electrodes. In this case as well, bulk waves in first-order thickness shear mode can be effectively excited if the value of d/p mentioned above is less than or equal to about 0.5.

As described above, the acoustic wave device 1, 31 uses bulk waves in first-order thickness shear mode. In the acoustic wave device 1, 31, the hollow portion 9 is provided so that vibration of the excitation region C of the piezoelectric layer 2 is not prevented. This allows for improved Q-factor even if the acoustic wave device is miniaturized.

The support substrate 8 of the acoustic wave device 1, 31 is made of, for example, silicon. The support substrate 8 includes a first surface and a second surface that are opposite to each other in the Z-direction. Preferably, the support substrate 8 is disposed over the second surface 2*b* of the piezoelectric layer 2 with the intermediate layer 7 interposed therebetween, at a location not overlapping an area where at least one pair of electrodes 3 and 4 is present. In the following description, it will sometimes be assumed that the first surface of the support substrate 8 is a surface near the second surface 2*b* of the piezoelectric layer 2, that is, a surface over which the intermediate layer 7 is stacked.

Figure 8:
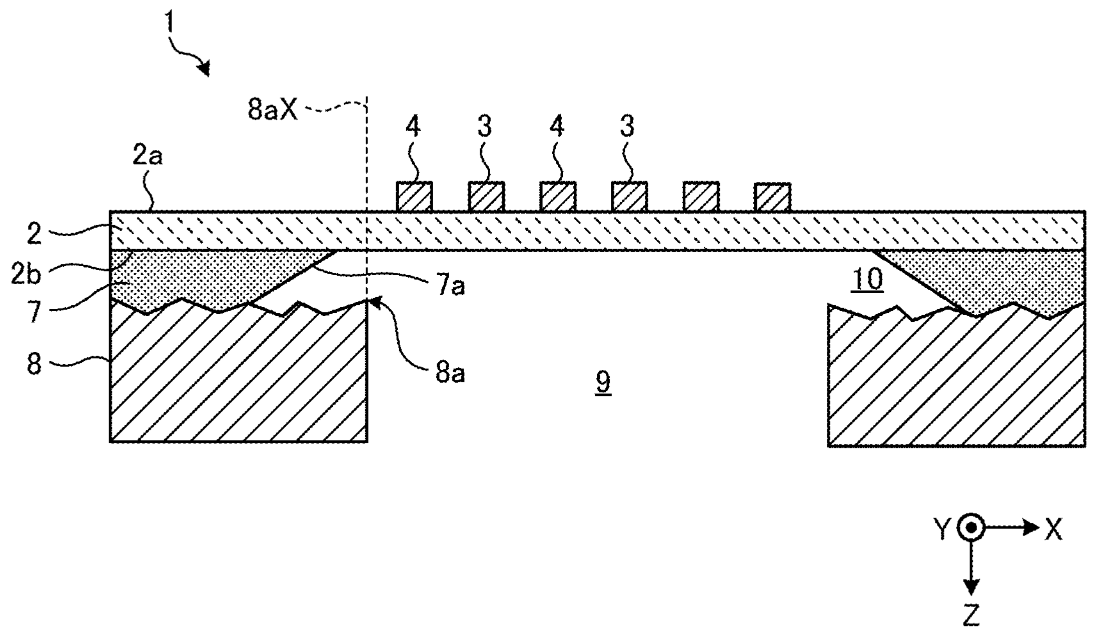
FIG. 8 is a cross-sectional illustration of the first preferred embodiment of the present invention taken along a line IX-IX in FIG. 1B.

FIG. 8 is a cross-sectional illustration of the first preferred embodiment taken along a line IX-IX in FIG. 1B. In FIG. 8, the inner wall of the cavity 7*a*, and the surface of the first surface of the support substrate 8 are depicted to appear larger than their actual sizes for ease of understanding. As illustrated in FIG. 8, the first surface of the support substrate 8 includes a surface that is roughened in at least the X-direction. More preferably, the first surface has a surface roughness greater than the surface roughness of the piezoelectric layer 2. Still more preferably, for example, the first surface has a surface roughness in terms of Ra of greater than or equal to about 0.5 nm and less than or equal to about 10 nm (equivalent to a PV value (Peak-to-Valley value) of greater than or equal to about 5 nm and less than or equal to about 100 nm). The surface roughness Ra of the first surface of the support substrate 8 is measured from a scanning transmission electron microscope (STEM) image obtained through observation of the first surface with a STEM. The magnification used for the measurement is, for example, 80000-fold.

The cavity 8*a* extends through the support substrate 8. That is, the hollow portion 9 extends through the support substrate 8 as illustrated in FIG. 8. The inner wall of the cavity 7*a* is located farther from the hollow portion 9 than is a location on the inner wall of the cavity 8*a*, the location being a location closest to the piezoelectric layer 2. That is, relative to the hollow portion 9, the inner wall of the cavity 7*a* is located outside with respect to a plane 8*ax* parallel or substantially parallel to a Y-Z plane including a location on the inner wall of the cavity 8*a* along the first surface of the support substrate 8, the location being a location closest to the piezoelectric layer 2. Due to the above-described structure, a void 10 is created in communication with the hollow portion 9. The void 10 is a space surrounded by the inner wall of the cavity 7*a*, the second surface 2*b* of the piezoelectric layer 2, and the first surface of the support substrate 8. The presence of the void 10 helps to reduce a residue of the inorganic film defining the intermediate layer 7.

Figure 9:
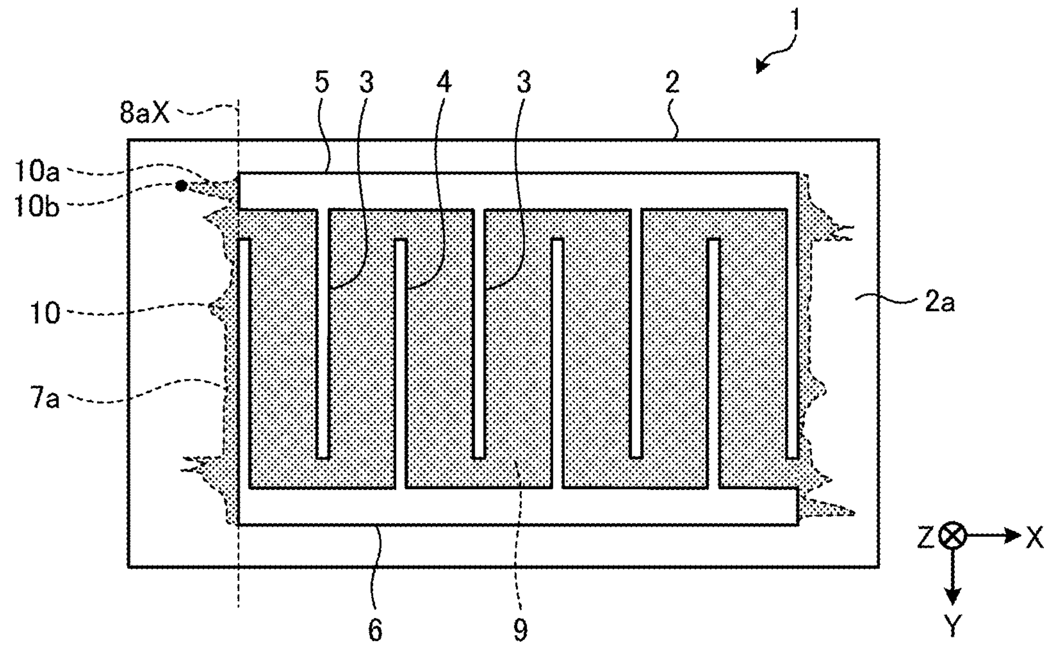
FIG. 9 is a plan view of an example of the acoustic wave device according to the first preferred embodiment of the present invention.

FIG. 9 is a plan view of an example of the acoustic wave device according to the first preferred embodiment. According to the first preferred embodiment, the piezoelectric layer 2 is made of, for example, lithium niobate or lithium tantalate, and the intermediate layer 7 is made of, for example, silicon oxide. The piezoelectric layer 2 and the intermediate layer 7 are thus capable of transmitting light. As illustrated in FIG. 9, this results in a difference in contrast between an area where the intermediate layer 7 and the support substrate 8 are spaced apart from each other (an area where the void 10 is present), and an area where the intermediate layer 7 and the support substrate 8 are in attachment with each other.

As illustrated in FIG. 9, the void 10 includes a recess 10*a*. The recess 10*a* is a portion of the void that is created due to the roughened surface of the support substrate 8. As seen in plan view in the Z-direction, the recess 10*a* extends outward from the inner wall of the cavity 8*a*, and decreases in width with increasing distance from the inner wall of the cavity 8*a*. To further reduce a residue of the intermediate layer 7, two or more recesses 10*a* are preferably provided along one side of the inner wall of the cavity 8*a*. Such a recess 10*a* has a maximum length of, for example, greater than or equal to about 1 μm and less than or equal to about 50 μm. The length of the recess 10*a* refers to the length from a tip 10*b* of the recess 10*a* to the plane 8*aX* as seen in plan view in the Z-direction. The tip 10*b* of the recess 10*a* refers to an acute vertex created as a result of narrowing of the recess 10*a*. As such, the tip 10*b* can be also said to be an endpoint of the recess 10*a*.

As described above, the acoustic wave device includes the support substrate 8, the intermediate layer 7 disposed over the support substrate 8, the piezoelectric layer 2 disposed over the intermediate layer 7, and the electrodes 3 and 4 disposed over the piezoelectric layer 2. A portion of the support substrate 8 includes the hollow portion 9. The hollow portion 9 overlaps at least a portion of the electrodes 3 and 4 in the Z-direction. The inner wall of the intermediate layer 7 is located farther from the hollow portion 9 than is a location on the inner wall of the support substrate 8, the location being a location closest to the piezoelectric layer 2, the inner wall of the support substrate 8 defining the hollow portion 9.

As described above with reference to the first preferred embodiment, the intermediate layer 7 includes the void 10. The void 10 is surrounded by the inner wall of the intermediate layer 7, the piezoelectric layer 2, and the support substrate 8, and communicates with the hollow portion 9 in the support substrate 8.

As described above with reference to the first preferred embodiment, as seen in plan view in the Z-direction, the void 10 in the intermediate layer 7 includes at least two recesses 10*a*.

The above-described configuration helps to reduce a residue of the intermediate layer 7 in a region that overlaps the hollow portion 9 in the support substrate 8 as seen in plan view in the Z-direction. This in turn makes it possible to reduce degradation of filter characteristics caused by such a residue of the intermediate layer 7.

As described above with reference to the first preferred embodiment, the recess 10*a* has a maximum length of, for example, greater than or equal to about 1 μm and less than or equal to about 50 μm. This allows for easy visual confirmation of reduction of a residue of the intermediate layer 7 in the region that overlaps the hollow portion 9 in the support substrate 8 as seen in plan view in the Z-direction. This in turn makes it possible to reduce degradation of filter characteristics caused by such a residue of the intermediate layer 7.

In the acoustic wave device 1, 31, a surface of the support substrate 8 over which the intermediate layer 7 is stacked has a surface roughness greater than the surface roughness of the piezoelectric layer 2. This helps to reduce spuriousness, and consequently reduce degradation of filter characteristics.

In a preferable aspect, a surface of the support substrate 8 over which the intermediate layer 7 is stacked has a surface roughness in terms of Ra of, for example, greater than or equal to about 0.5 nm and less than or equal to about 10 nm. This helps to reduce spuriousness, and consequently reduce degradation of filter characteristics.

In the acoustic wave device 1, 31, the intermediate layer 7 is made of, for example, silicon oxide. This configuration makes the intermediate layer 7 translucent, which in turn enables visual inspection for the presence of a residue of the intermediate layer 7 as seen in plan view in the Z-direction. As a result, degradation of filter characteristics caused by such a residue of the intermediate layer 7 can be reduced.

In the acoustic wave device 1, 31, the hollow portion 9 in the support substrate 8 extends through the support substrate 8. This helps to reduce a residue of the intermediate layer 7 in a region that overlaps the hollow portion 9 in the support substrate 8 as seen in plan view in the Z-direction. This in turn makes it possible to reduce degradation of filter characteristics caused by such a residue of the intermediate layer 7.

In the acoustic wave device 1, 31, an electrode includes the first electrodes 3, the first busbar electrode 5 with which the first electrodes 3 are connected, the second electrodes 4, and the second busbar electrode 6 with which the second electrodes 4 are connected. This configuration makes it possible to provide an acoustic wave device with improved resonance characteristics.

In a preferable aspect, the piezoelectric layer 2 has a thickness d of, for example, less than or equal to 2p, where p is the center-to-center distance between mutually adjacent first and second electrodes 3 and 4 among the first electrodes 3 and the second electrodes 4. This allows for miniaturization of the acoustic wave device, and also improved Q-factor.

In the acoustic wave device 1, 31, the piezoelectric layer 2 includes, for example, lithium niobate or lithium tantalate. This configuration makes the piezoelectric layer 2 translucent, which in turn enables visual inspection for the presence of a residue of the intermediate layer 7 as seen in plan view in the Z-direction. As a result, degradation of filter characteristics caused by such a residue of the intermediate layer 7 can be reduced.

In a preferable aspect, the acoustic wave device is capable of using a plate wave. This makes it possible to provide an acoustic wave device with improved resonance characteristics.

In a preferable aspect, the acoustic wave device is capable of using a bulk wave in thickness shear mode. This allows for improved coupling coefficient, and consequently makes it possible to provide an acoustic wave device with improved resonance characteristics.

In a preferable aspect, the electrode includes at least one pair of electrodes that face each other, and a value of d/p is, for example, less than or equal to about 0.5, where d is the thickness of the piezoelectric layer 2, and p is the center-to-center distance between the first electrode 3 and the second electrode 4. This allows for miniaturization of the acoustic wave device, and also improved Q-factor.

In a more preferable aspect, the value of d/p is, for example, less than or equal to about 0.24. This allows for miniaturization of the acoustic wave device, and also improved Q-factor.

Method for Manufacturing Acoustic Wave Device

Figure 10:
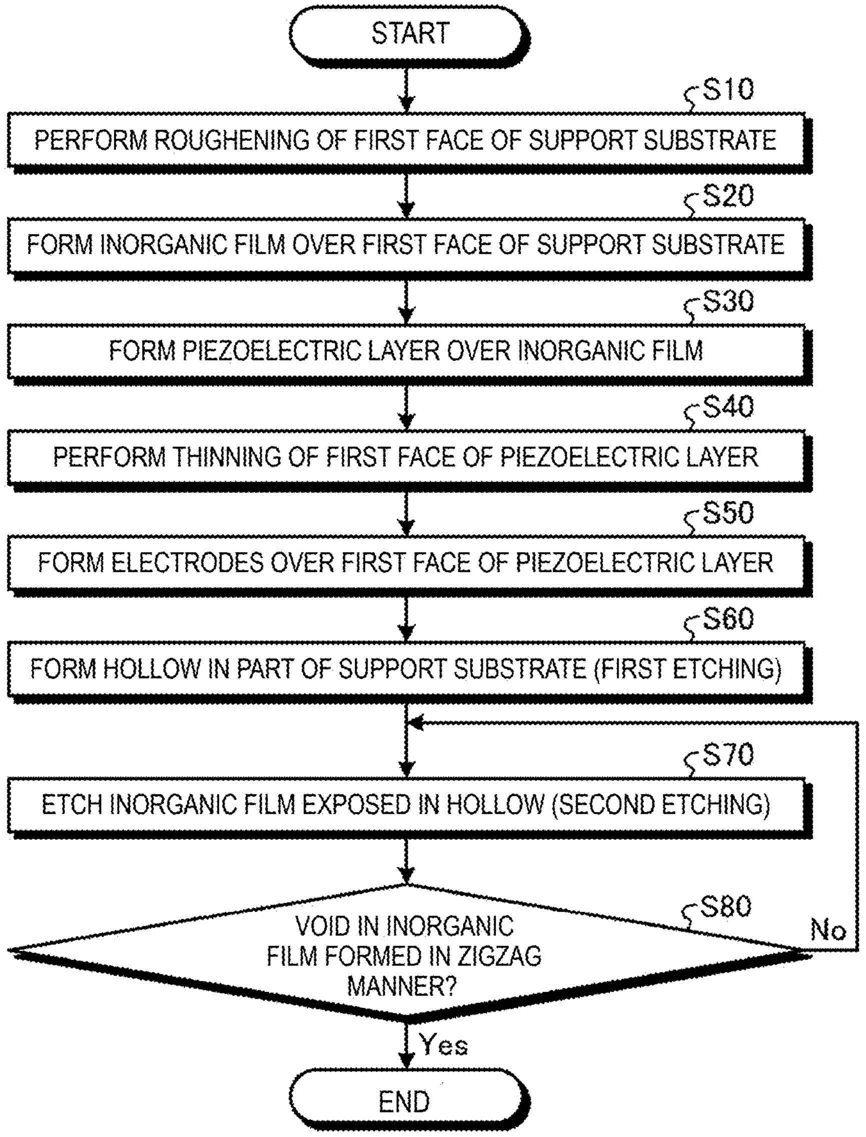
FIG. 10 is a flowchart illustrating a method for manufacturing the acoustic wave device according to the first preferred embodiment of the present invention.

A non-limiting example of a manufacturing method for the acoustic wave device 1 according to the first preferred embodiment will be described below. FIG. 10 is a flowchart illustrating a method for manufacturing the acoustic wave device according to the first preferred embodiment.

The first surface of the support substrate 8 is roughened by, for example, machining such as sandblasting (step S10). At this time, the first surface of the support substrate 8 is roughened with respect to at least the X-direction.

Subsequently, the silicon oxide for the intermediate layer 7 is formed over the first surface of the support substrate 8 by, for example, sputtering or other methods (step S20). At this time, a face of the intermediate layer 7 over which the piezoelectric layer 2 is to be formed is flattened by, for example, polishing.

Subsequently, the piezoelectric layer 2 is formed over the intermediate layer 7 (step S30). According to the first preferred embodiment, the piezoelectric layer 2 is stacked by depositing silicon oxide over the second surface 2*b* of the piezoelectric layer 2 by, for example, atomic layer deposition (ALD), sputtering, or other techniques, and then joining the deposited silicon oxide to the intermediate layer 7. The stacking method, however, is not limited to the above-described method. Alternatively, for example, the piezoelectric layer 2 may be directly joined to the intermediate layer 7.

Subsequently, the first surface 2*a* of the piezoelectric layer 2 is thinned (step S40). At this time, the first surface 2*a* of the piezoelectric layer 2 is polished to a desired thickness by, for example, mechanical polishing, CMP (Chemical Mechanical Polishing), or any other suitable method.

Subsequently, the electrode 3, the electrode 4, the first busbar electrode 5, and the second busbar electrode 6 are formed over the first surface 2*a* of the piezoelectric layer 2 (step S50). According to the first preferred embodiment, these electrodes are formed by forming metal films by, for example, sputtering, vapor deposition, or other techniques. These electrodes, however, may be formed by any suitable method. A protective film of, for example, silicon oxide or other material may be formed over these electrodes as required.

Subsequently, a portion of the support substrate 8 is etched (first etching) to thus form the hollow portion 9 (step S60). An example of the first etching is dry etching or reactive ion etching. At this time, the hollow portion 9 is formed so as to extend through the support substrate 8. Since the intermediate layer 7 defines and functions as a stopper against etching, the piezoelectric layer 2 can be protected against etching.

Subsequently, the intermediate layer 7 exposed in the hollow portion 9 is etched (second etching) (step S70). An example of the second etching is wet etching. At this time, as a result of the hollow portion 9 extending through the support substrate 8, the etchant readily penetrates in the intermediate layer 7, which allows for stable etching. The hollow portion 9 is formed such that the inner wall of the cavity 7*a* is located farther away relative to the location of the inner wall of the cavity 8*a*. That is, the void 10 is also formed along the inner wall of the cavity 8*a*.

Subsequently, visual inspection is performed to determine whether the void 10 has been formed in a zigzag manner (step S80). According to the first preferred embodiment, the visual inspection is performed based on the difference in contrast between two areas as seen in plan view, one where the void 10 is present and one where the intermediate layer 7 and the support substrate 8 are in attachment with each other.

As illustrated in FIG. 9, if it is determined through the visual inspection that the void 10 in the intermediate layer 7 has been formed in a zigzag manner along the inner wall of the cavity 8*a* (step S80: Yes), the second etching is finished. When the void 10 is described herein as being formed in a zigzag manner, this means that as seen in plan view, the void 10 includes two or more recesses 10*a* formed along the inner wall of the cavity 7*a*.

Figure 11:
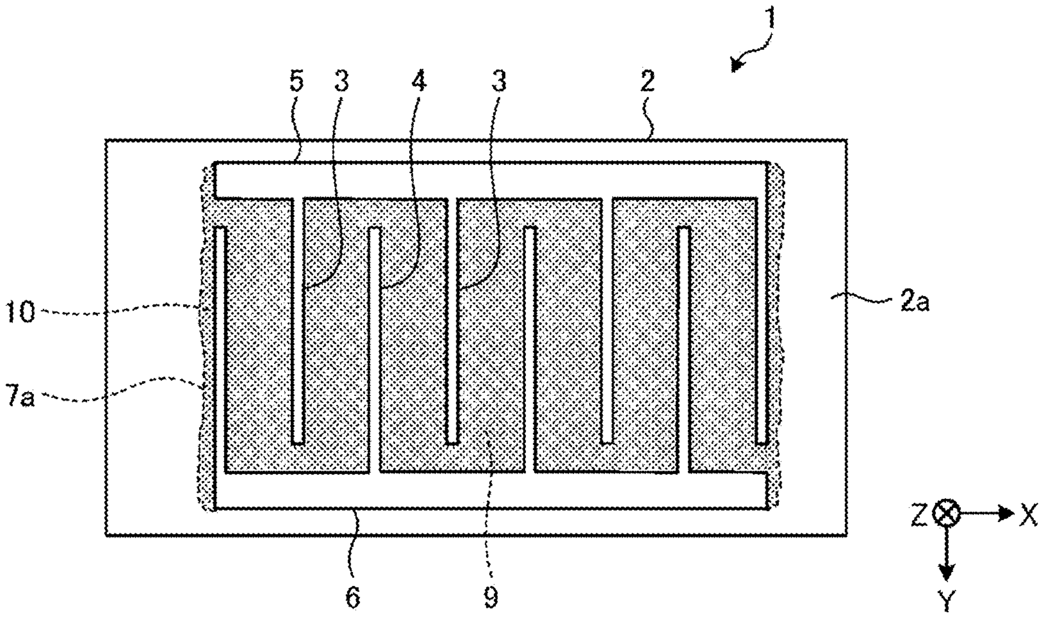
FIG. 11 is a plan view of the acoustic wave device to the first preferred embodiment of the present according invention, illustrating an exemplary case where etching is insufficient.

FIG. 11 is a plan view of the acoustic wave device according to the first preferred embodiment, illustrating an exemplary case where etching is insufficient. As illustrated in FIG. 11, if it is determined through the visual inspection that the void 10 in the intermediate layer 7 has not been formed in a zigzag manner along the inner wall of the cavity 7*a* (step S80: No), that is, if no recess 10*a* has been formed along the inner wall of the cavity 8*a*, then the second etching is performed again. As a result, the intermediate layer 7 is sufficiently removed by etching. This makes it possible to reduce degradation of filter characteristics caused by a residue of the intermediate layer 7.

The acoustic wave device 1 according to the first preferred embodiment can be manufactured through the process described above. The above-described method for manufacturing the acoustic wave device 1 is illustrative only, and may be modified or altered as appropriate. For example, the step of forming the electrode 3 and the electrode 4 (step S50) may be performed after the step of forming the hollow portion 9 (steps S60).

As described above, the method for manufacturing the acoustic wave device includes a roughening step for the support substrate 8, which is the step of roughening the first surface of the support substrate 8 that has the first surface and the second surface, an inorganic-film forming step of forming the intermediate layer 7 over the first surface, a piezoelectric-layer forming step of forming the piezoelectric layer 2 over the intermediate layer 7, a piezoelectric-layer thinning step of thinning the piezoelectric layer 2; an electrode-forming step of forming the electrode 3 and the electrode 4 over the piezoelectric layer 2, a first etching step of forming the hollow portion 9 in part of the support substrate 8, and a second etching step of etching the intermediate layer 7 exposed in the hollow portion 9.

The above-described process makes it possible to prevent etching from being finished with a residue of the intermediate layer 7 remaining. This in turn makes it possible to reduce degradation of filter characteristics caused by such a residue of the intermediate layer 7.

As described above with reference to the first preferred embodiment, the first surface of the support substrate 8 has a surface roughness in terms of Ra of, for example, greater than or equal to about 0.5 nm and less than or equal to about 10 nm. This helps to reduce spuriousness, and consequently reduce degradation of filter characteristics.

As described above with reference to the first preferred embodiment, in the second etching step, the void 10 is formed in the intermediate layer 7, the void 10 being surrounded by the inner wall of the intermediate layer 7, the piezoelectric layer 2, and the support substrate 8. Further, as seen in plan view in the Z-direction, the second etching step is finished with the void 10 in the intermediate layer 7 being formed in a zigzag manner along the inner wall of the support substrate 8. This allows etching to be finished with no residue of the intermediate layer 7 being present. This in turn makes it possible to reduce degradation of filter characteristics caused by such a residue of the intermediate layer 7.

Second Preferred Embodiment

Figure 12:
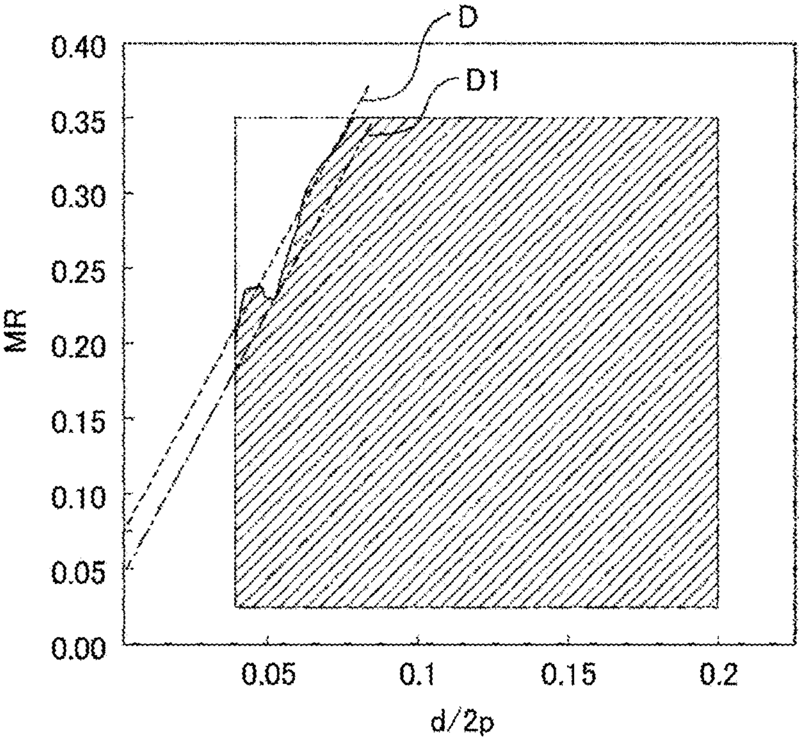
FIG. 12 is an illustration for explaining, for an acoustic wave device according to a second preferred embodiment of the present invention, a relationship between d/2p, metallization ratio MR, and fractional band width.

FIG. 12 is an illustration for explaining, for an acoustic wave device according to a second preferred embodiment of the present invention, relationship between d/2p, the metallization ratio MR, and fractional band width. Features according to the second preferred embodiment that are the same or substantially the same as those according to the first preferred embodiment will be designated by the same reference signs and will not be described in further detail. As the acoustic wave device 1 according to the second preferred embodiment, acoustic wave devices 1 with different values of d/2p and MR are provided, and their fractional band widths are measured. The hatched region on the right-hand side of a broken line D in FIG. 12 represents a region with a fractional band width of less than or equal to about 17%. The boundary between the hatched region and a non-hatched region is represented as $MR=3.5(d/2p)+0.075$. That is, $MR=1.75(d/p)+0.075$. Accordingly, it is preferable that $MR\leq1.75(d/p)+0.075$. In that case, a fractional band width of less than or equal to about 17% can be easily obtained. A more preferable example of the above-described region is the region on the right-hand side of an alternate long and short dashed line D1 in FIG. 12 that represents $MR=3.5(d/2p)+0.05$. In other words, if $MR\leq1.75(d/p)+0.05$, this allows a fractional band width of less than or equal to about 17% to be obtained with reliability.

Third Preferred Embodiment

Figure 13:
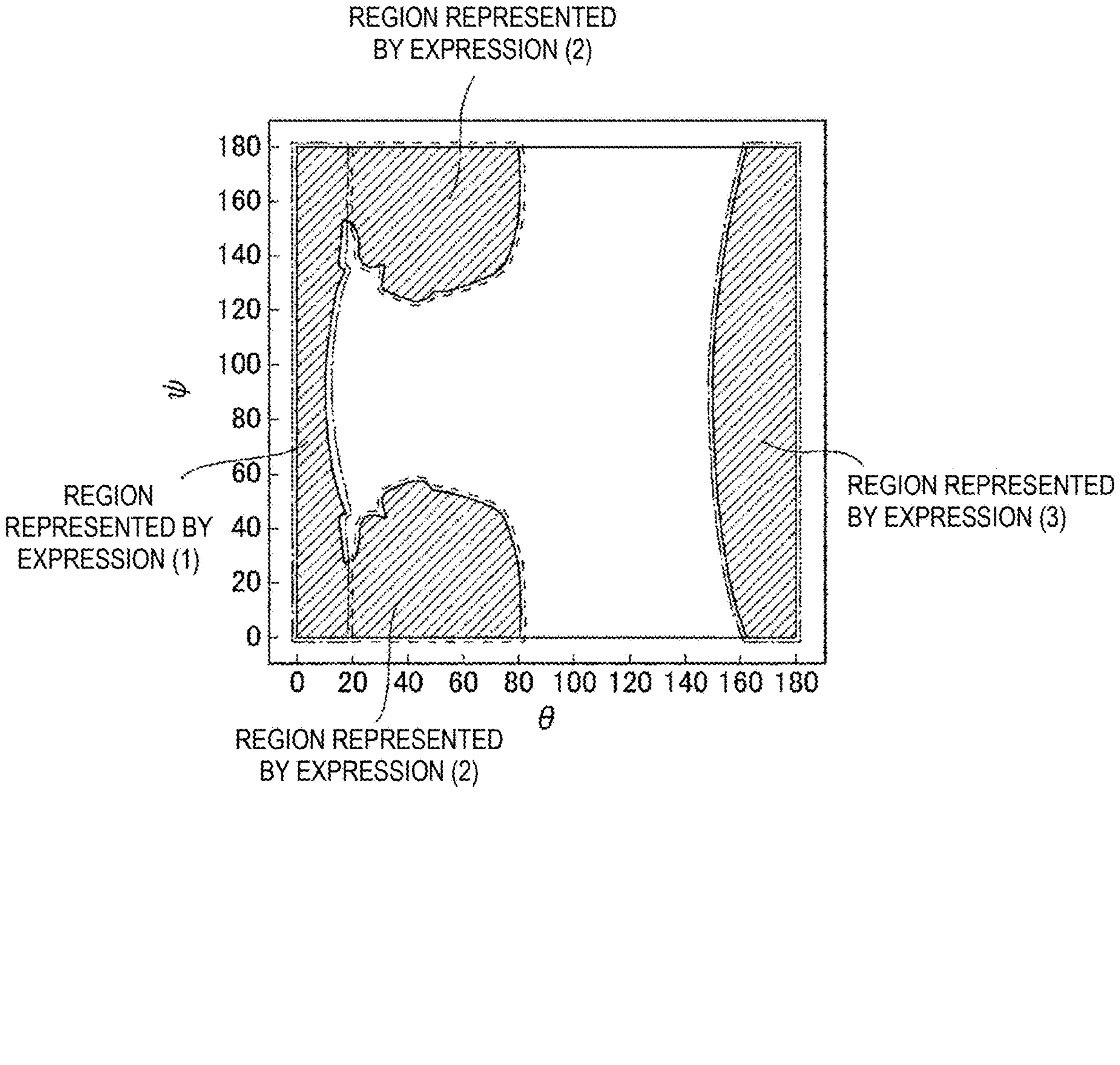
FIG. 13 illustrates, for an acoustic wave device according to a third preferred embodiment of the present invention, a map of fractional band width with respect to the Euler angles (0°, θ, ψ) of $LiNbO_3$ with d/p set as close to zero as possible.

FIG. 13 illustrates, for an acoustic wave device according to a third preferred embodiment of the present invention, a map of fractional band width with respect to the Euler angles (0°, θ, ψ) of $LiNbO_3$ with d/p set as close to zero as possible. Features according to the third preferred embodiment that are the same or substantially the same as those according to the first preferred embodiment will be designated by the same reference signs and will not be described in further detail. Hatched regions in FIG. 13 represent regions where a fractional band width of at least greater than or equal to about 5% is obtained. The ranges of individual regions are approximated by Expressions (1), (2), and (3) below.

$$(0°\pm10°,\ 0°\text{ to }20°,\ \text{any }\psi) \tag{1}$$

$$(0°\pm10°,\ 20°\text{ to }80°,\ 0°\text{ to }60°\ (1-(\theta-50)^2/900)^{1/2})\text{ or }(0°\pm10°,\ 20°\text{ to }80°,\ [180°-60°\ (1-(\theta-50)^2/900)^{1/2}]\text{ to }180°) \tag{2}$$

$$(0°\pm10°,\ [180°-30°\ (1-(\psi-90)^2/8100)^{1/2}]\text{ to }180°,\ \text{any }\psi) \tag{3}$$

Therefore, Euler angles within the range represented by Expression (1), (2), or (3) are preferable from the viewpoint of achieving a sufficiently large fractional band width.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
- a support substrate;
- an inorganic film located over the support substrate;
- a piezoelectric layer located over the inorganic film; and
- an electrode located over the piezoelectric layer; wherein
- a portion of the support substrate includes a hollow portion;
- the hollow portion overlaps at least a portion of the electrode in a thickness direction of the support substrate;
- an inner wall of the inorganic film is located farther from the hollow portion than a location on an inner wall of the support substrate, the location being closest to the piezoelectric layer, the inner wall of the support substrate defining the hollow portion; and
- the inorganic film includes a void surrounded by the inner wall of the inorganic film, the piezoelectric layer, and the support substrate, the void communicating with the hollow portion in the support substrate.

2. The acoustic wave device according to claim 1, wherein the inorganic film includes at least two recesses in a direction that crosses the thickness direction.

3. The acoustic wave device according to claim 2, wherein in the direction that crosses the thickness direction, each of the at least two recesses has a maximum length of greater than or equal to about 1 μm and less than or equal to about 50 μm.

4. The acoustic wave device according to claim 1, wherein a surface of the support substrate over which the inorganic film is located has a surface roughness greater than a surface roughness of the piezoelectric layer.

5. The acoustic wave device according to claim 3, wherein a surface of the support substrate over which the inorganic film is located has a surface roughness in terms of Ra of greater than or equal to about 0.5 nm and less than or equal to about 10 nm.

6. The acoustic wave device according to claim 1, wherein the inorganic film is made of silicon oxide.

7. The acoustic wave device according to claim 1, wherein the hollow portion in the support substrate extends through the support substrate.

8. The acoustic wave device according to claim 1, wherein the electrode includes a plurality of first electrodes, a first busbar electrode, a plurality of second electrodes, and a second busbar electrode, the plurality of first electrodes being connected to the first busbar electrode, the plurality of second electrodes being connected to the second busbar electrode.

9. The acoustic wave device according to claim 8, wherein the piezoelectric layer has a thickness of less than or equal to 2p, where p is a center-to-center distance between a first electrode and a second electrode that are adjacent to each other among the plurality of first electrodes and the plurality of second electrodes.

10. The acoustic wave device according to claim 1, wherein the piezoelectric layer includes lithium niobate or lithium tantalate.

11. The acoustic wave device according to claim 10, wherein the acoustic wave device is structured to generate a plate wave.

12. The acoustic wave device according to claim 10, wherein the acoustic wave device is structured to generate a bulk wave in thickness shear mode.

13. The acoustic wave device according to claim 1, wherein the electrode includes at least one pair of electrodes that face each other; and a value of d/p≤about 0.5, where d is a thickness of the piezoelectric layer, and p is a center-to-center distance between the electrodes that are adjacent to each other.

14. The acoustic wave device according to claim 13, wherein the value of d/p is less than or equal to about 0.24.

15. The acoustic wave device according to claim 8, wherein a metallization ratio MR satisfies MR≤about 1.75 (d/p)+0.075, the metallization ratio MR being a ratio of an area of the first electrode and the second electrode within an excitation region to the excitation region, the excitation region being a region where the first electrode and the second electrode overlap each other as seen in a direction in which the first electrode and the second electrode face each other.

16. The acoustic wave device according to claim 15, wherein a single second electrode is located between adjacent ones of the first electrodes.

17. The acoustic wave device according to claim 1, wherein lithium niobate or lithium tantalate included in the piezoelectric layer has Euler angles (φ, θ, ψ) within a range represented by Expression (1), Expression (2), or Expression (3):

$$(0°\pm10°,\ 0° \text{ to } 20°,\ \text{any } \psi) \quad (1)$$

$$(0°\pm10°,\ 20° \text{ to } 80°,\ 0° \text{ to } 60° (1-(\theta-50)^2/900)^{1/2}) \text{ or } (0°\pm10°,\ 20° \text{ to } 80°,\ [180°-60° (1-(\theta-50)^2/900)^{1/2}] \text{ to } 180°) \quad (2)$$

$$(0°\pm10°,\ [180°-30° (1-(\psi-90)^2/8100)^{1/2}] \text{ to } 180°,\ \text{any } \psi) \quad (3).$$

18. A method for manufacturing an acoustic wave device, the method comprising:

roughening a first surface of a support substrate, the support substrate including the first surface and a second surface;

forming an inorganic film over the first surface;

forming a piezoelectric layer over the inorganic film;

thinning the piezoelectric layer;

forming an electrode over the piezoelectric layer;

forming a hollow portion in a portion of the support substrate; and etching the inorganic film exposed in the hollow portion; wherein in the etching the inorganic film, a void is formed in the inorganic film, the void being surrounded by an inner wall of the inorganic film, the piezoelectric layer, and the support substrate; and the etching the inorganic film is finished with the void in the inorganic film formed in a zigzag manner in a direction that crosses a thickness direction of the support substrate.

19. The method according to claim 18, wherein the first surface has a surface roughness in terms of Ra of greater than or equal to about 0.5 nm and less than or equal to about 10 nm.

* * * * *